United States Patent
Hebing et al.

(10) Patent No.: US 6,310,470 B1
(45) Date of Patent: Oct. 30, 2001

(54) METHOD AND DEVICE FOR MEASURING THE DIFFERENCE IN MAGNETIC FIELD STRENGTH WITH MAGNETORESISTIVE SENSORS

(75) Inventors: Ludger Hebing, Asslar; Juergen Kunze, Wetzlar; Thomas Kammer, Biebertal; Andreas Buente; Jan Thorsten Weber, both of Heuchelheim, all of (DE)

(73) Assignee: Lust Antriebstechnik GmbH, Lahnau-Waldgirmes (DE)

( * ) Notice: Subject to any disclaimer, the term of this patent is extended or adjusted under 35 U.S.C. 154(b) by 0 days.

(21) Appl. No.: 09/062,655

(22) Filed: Apr. 20, 1998

(30) Foreign Application Priority Data

Apr. 19, 1997 (DE) .............................. 197 16 518
Nov. 3, 1997 (DE) .............................. 197 48 550

(51) Int. Cl.$^7$ .................................................. G01B 15/20
(52) U.S. Cl. ....................................... 324/117 R; 324/127
(58) Field of Search ...................... 324/117 R, 117 H, 324/251, 252, 127; 338/32 H, 32 R

(56) References Cited

U.S. PATENT DOCUMENTS

| | | | |
|---|---|---|---|
| 5,172,052 | * 12/1992 | Wells ................................ | 324/117 H |
| 5,594,332 | * 1/1997 | Harman et al. ...................... | 324/127 |
| 5,621,377 | 4/1997 | Dettmann et al. ................... | 338/32 R |
| 5,686,879 | * 11/1997 | Schuhl et al. ...................... | 338/32 R |
| 5,719,494 | 2/1998 | Dettmann et al. .................... | 324/117 |

FOREIGN PATENT DOCUMENTS

| | | |
|---|---|---|
| 1 248 157 | 2/1964 | (DE) . |
| 2 360 753 | 6/1974 | (DE) . |
| 27 04 764 | 5/1978 | (DE) . |
| 84 00 275 U1 | 5/1984 | (DE) . |
| 3620 439 | 12/1987 | (DE) . |
| 42 30 059 | 3/1994 | (DE) . |
| 43 00 605 | 7/1994 | (DE) . |
| 44 36 876 | 4/1996 | (DE) . |
| 0 181 759 A2 | 5/1986 | (EP) . |
| 0 292 636 A1 | 11/1988 | (EP) . |
| 0 597 404 | 5/1994 | (EP) . |
| 0 607 595 A2 | 7/1994 | (EP) . |
| 0710844 A2 | 5/1996 | (EP) . |
| 59-79860 | 5/1984 | (JP) . |
| 358157 | 11/1961 | (SE) . |

OTHER PUBLICATIONS

Federal Republic of Germany Abstract, DE 4300605, Jul. 1994.
European Abstract, EP 597404, May 1994.
"Vector Control of A.C. Maschines", Peter Vas, Oxford Science Publications, 1994, pp 6–13.
E. Kolb, *Neues Messverfahren Fuer Echtzeitstromsensoren Und Die Anwendung In Der Prueftechnik, 118 Messen Pruefen Automatisieren* (Dec. 1989) No. 12, Munchen, DE.

* cited by examiner

*Primary Examiner*—Walter E. Snow
(74) *Attorney, Agent, or Firm*—Foley & Lardner

(57) ABSTRACT

A method and device for measuring electric currents in n conductors ($n \geq 2$), the measurement of the currents being carried out with (n−1) magnetoresistive sensors. Reliable excess current and/or fault current protection is obtained.

20 Claims, 3 Drawing Sheets

METHOD AND DEVICE FOR MEASURING THE DIFFERENCE IN MAGNETIC FIELD STRENGTH WITH MAGNETORESISTIVE SENSORS

BACKGROUND OF THE INVENTION

The present invention relates to a method and a device for measuring electric currents in n conductors where n is a natural number and n≧2.

It is generally known to measure electric currents using a magnetoresistive sensor, in which the output signal is proportional to an electric current to be measured, as described in DE-PS 43 00 605 C2. The magnetoresistive sensor can be used to carry out a potential-free measurement of the current strength of an electric current such that the magnetic field caused by the electric current and the magnetic field gradients are measured with the sensor.

When polyphase currents are to be measured, Hall transducers are used. The disadvantage of Hall transducers is that, due to the physically prescribed magnetic field sensitivity of the Hall elements, an iron core (laminated cores or ferrites) has to be used to guide the flux and concentrate the field. This results in a relatively large overall volume which is an obstacle for integration of the device into planar design technology, such as hybrid circuits. In addition, the Hall elements have to be mounted in an air gap in the flux concentrator, which increases the expenditure for maintaining the air gaps and creepage paths, if the measuring conductor cannot be adequately insulated with respect to the iron core.

According to another known technique described in EP 597 404 A2, operations are carried out with fewer sensors than the number of currents to be determined. For example, the currents of a three-conductor system are sensed with two sensors. According to this technique, it is not the individual magnetic field of the electric conductor which is used for measurement purposes (page 2, lines 50 to 52) but rather the total magnetic field which is produced in a multiconductor system through superimposition of the individual magnetic fields. Determining the field strengths by means of vectors requires the angles of the arrangement to be known. As a result, a complex calculation is necessary which is undesirable.

Furthermore, in the known technique there is a need for sensors which supply an electrical measurement signal which is proportional to the vectorial magnetic field strength.

SUMMARY OF THE INVENTION

It is an object of the present invention to provide a method and device for measuring electric currents in at least two conductors, by using a technically simple and compact design of the measuring arrangement and by determining the desired values by means of a simple calculation.

In accordance with the invention, magnetoresistive sensors are used which are designed as gradiometers to sense the difference in the magnetic field strengths produced by the conductor currents, such that when there are n conductors, n−1 scalar variables are obtained. According to the invention, the desired values are obtained by means of a simple calculation.

In accordance with an embodiment of the invention, the measurement of electric currents in n conductors is carried out with only n−1 magnetoresistive sensors (n≧2). Contrary to the conventional measurement with Hall sensors; according to the invention, no flux concentrators are needed, since the magnetic field of sensitivity of the magnetoresistive technology is greater than that of the Hall effect approximately by a factor of 20. Furthermore, the magnetoresistive sensors have a very compact design, as compared to the current sensors based on the Hall effect, which use an iron core for guiding the flux and concentrating the field. Such a core is not required in the case of magnetoresistive sensors. Furthermore, in the case of magnetoresistive sensors, the conductor for field compensation is integrated into the sensor chip as a microsystem, thereby resulting in a very compact design. Furthermore, the technology which is based on magnetoresistive current sensors does not require any auxiliary energy at high measurement potential, such as is required, for example, when measuring currents with separated potentials at shunt resistors.

In another embodiment of the invention flux concentrators are used. However, the compact design according to the invention is retained, in contrast to the conventional art, since the arrangement of the flux concentrators enables the magnetoresistive sensors to be arranged more closely one next to the other. As a result, it is ensured that the compact design achieved by using the magnetoresistive sensors is retained.

In magnetoresistive sensor technology, the measurement of currents is also reduced to the measurement of the magnetic currents of conductors through which current is flowing.

According to the invention, electric currents can be measured in at least two conductors with a simple and compact design. For example, a polyphase current measurement can be carried out at the motor output of a power inverter. The present method can also be applied, for example, in electronic power actuators for electric drives, such as in frequency converters or in servo controllers.

By virtue of the fact that electric currents are measured and determined in n conductors with n−1 magnetoresistive sensors, in a further embodiment of the invention, the present method and device can be used for fault detection. By determining the current strength of the individual currents, excess current and/or fault current can be detected, thereby protecting appropriate modules for drive applications.

Furthermore, according to the invention, other variables, such as voltage and power levels, can be derived from the current measurement.

In the case of a short circuit, reliable deactivation of an output stage requires reaction times to be shorter than ten microseconds. This protection can be ensured with the device according to the invention.

An overload protection can be carried out, for example, by monitoring the integral $\int i^2 dt$ or $\int i dt$ or via a temperature sensor.

For a polyphase current, according to the invention, two magnetoresistive sensors are necessary to determine the current strength of the three phase currents.

The output signal supplied by the magnetoresistive sensors is a signal which is proportional to the electric current to be measured. Depending on the direction in which the current is flowing in the current conductors, the sensors measure the difference in the magnetic fields of the current conductors or the magnetic fields are summed.

If a measurement of a polyphase current is carried out and the three phase currents have a positive current direction, the two magnetoresistive sensors provided in the measurement of the polyphase current measure the difference in the strength of the magnetic fields of, in each case, two of the three current conductors and in each case, output directly as an output signal a voltage which is in proportion to the difference between the respective current strength of the phase currents. By forming the equations for this and using the rule that the sum of all the current strengths at any time is equal to zero, appropriate relationships can be produced, with the result that desired conclusions can be derived regarding the three conductors by using two sensors.

In the measuring arrangement according to the invention, with flux concentrators, in which arrangement the conductors extend through ferrite cores, the following advantages occur:

(a) decoupling of field strength and field profile from the conductor geometry is obtained;

(b) an increase in primary conductor cross section, since the flux concentration is no longer performed by making the conductor tracks narrower; as a result of the enlarged primary conductor cross section, the power loss is lower; as a result of this, implementation as an SMD (Surface Mounted Device) module is provided;

(c) magnetic shielding by means of the ferrite core, and less Eddy current is produced in a metal substrate serving, if appropriate, as a circuit carrier and/or cooling surface mounted under the measuring arrangement, for example in an IMS (Insulated Metal Substrate) or DCB (Direct Copper Bonding) substrate, or in other adjacent metal components, such as housing elements;

(d) reduction in the electromagnetic influence of the skin effect or proximity effect;

(e) screening with respect to external magnetic interference fields; and (f) more compact design as a result of flux concentration.

The design of the measuring arrangement with flux concentrators does not require more space than the design without flux concentrators although the flux concentrators basically require somewhat more space. This is due to the fact that when flux concentrators are used, the sensors can be arranged more closely to one another and the space requirement thus remains approximately the same.

BRIEF DESCRIPTION OF THE DRAWINGS

The embodiments of the invention are illustrated in the drawings, in which.

DETAILED DESCRIPTION OF THE PREFERRED EMBODIMENTS

Figure 1:
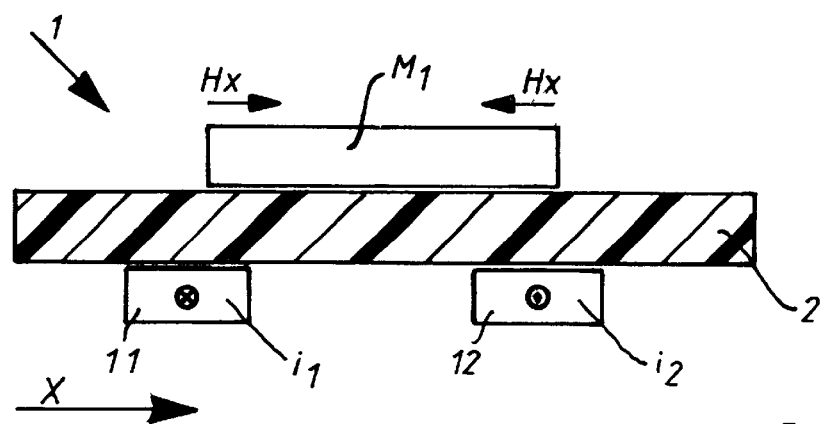
FIG. 1 shows one embodiment according to the invention.

FIG. 1 shows a device (1) with a sensor chip ($M_1$) which is arranged on an insulator (2). For example, a sensor chip as described in U.S. Pat. No. 5,621,377, the contents of which are hereby incorporated by reference, could be used.

On the side of the insulator (2) located opposite the sensor chip ($M_1$), two electric current conductors (11, 12) are arranged. A current of strength $i_1$ flows in the current conductor (11) and a current of strength $i_2$ flows in the current conductor (12). The direction of the current in the current conductor (11) points into the plane of the drawing, and the direction of the current in the current conductor (12) points out of the plane of the drawing.

Figure 2:
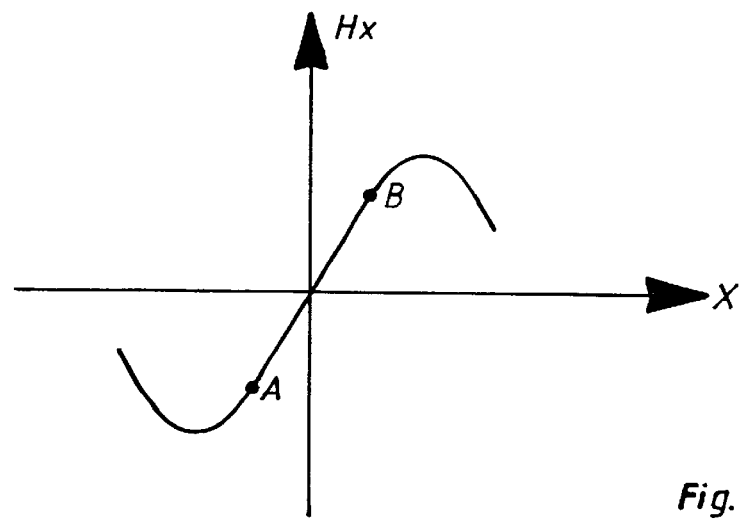
FIG. 2 shows a diagram of the field of strength occurring according to FIG. 1.

If the magnetic field which is caused by the current is viewed in the X direction, a curve illustrated in FIG. 2 is obtained. The magnetoresistive sensor ($M_1$) is designed as a sensor which measures field gradients, with the result that the sensor can be used to measure the difference in the magnetic field, for example, between the measurement points A and B.

Returning to FIG. 3, three current conductors (21, 22, 23) are shown in which currents of strength $i_1$, $i_2$, $i_3$ flow. According to FIG. 3, the currents flow in the same direction. In this case, it is not relevant whether the direction points into the plane of the drawing or out of the plane of the drawing.

The sensors ($M_1$ and $M_2$) measure the differences in the magnetic field strengths of the current conductors (21, 22; 22, 23) and output directly as an output signal in each case a voltage with a value which is proportional to the difference between the respective current strengths $i_1$, $i_2$, $i_3$.

In this way, the following relationships are obtained:

$$u_{M1}=K_1(i_1-i_2) \tag{1}$$

$$u_{M2}=K_2(i_2-i_3) \tag{2}$$

where K=proportionality factor

By virtue of the rule that for a polyphase current, the sum of the three current strengths is equal to zero, a third equation is obtained:

$$\Sigma i_n=i_1+i_2+i_3=0, \text{ where } n=1, 2, 3 \tag{3}$$

Three equations are thus provided for the three unknown values $i_1$, $i_2$, $i_3$.

If the difference in the voltages obtained at the sensors ($M_1$ and $M_2$) as an output signal is formed, the following relationship is obtained:

$$u_{M1}-u_{M2}=K_1(i_1-i_2)-K_2(i_2-i_3) \tag{4}$$

If the sum of the voltages obtained at the sensors ($M_1$ and $M_2$) is formed, the following relationship is obtained:

$$u_{M1}+u_{M2}=K_1(i_1-i_2)+K_2(i_2-i_3) \tag{5}$$

From equation (3), it follows that:

$$i_1+i_3=-i_2 \tag{6}$$

Figure 3:
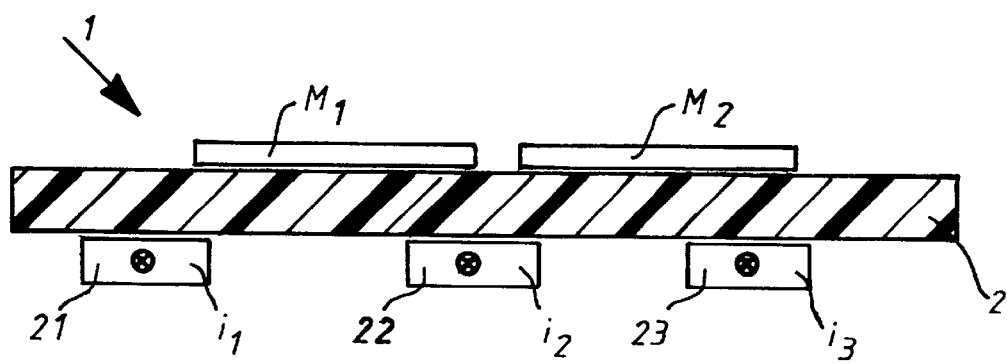
FIG. 3 shows another embodiment according to the invention.

In an arrangement according to FIG. 3, through appropriate calibration, $K_1=K_2=K$ can be set. The following thus results from equations (4) and (6):

$$u_{M1}-u_{M2}=K(i_1+i_3-2i_2)=K(-3i_2)$$

By means of further corresponding calculations, the corresponding values for the current strengths $i_1$ and $i_3$ are obtained, so that by using the voltages obtained by the magnetoresistive sensors ($M_1$, $M_2$), the currents $i_1$, $i_2$, $i_3$ flowing in the current conductor (21, 22, 23) are derived.

Figure 4:
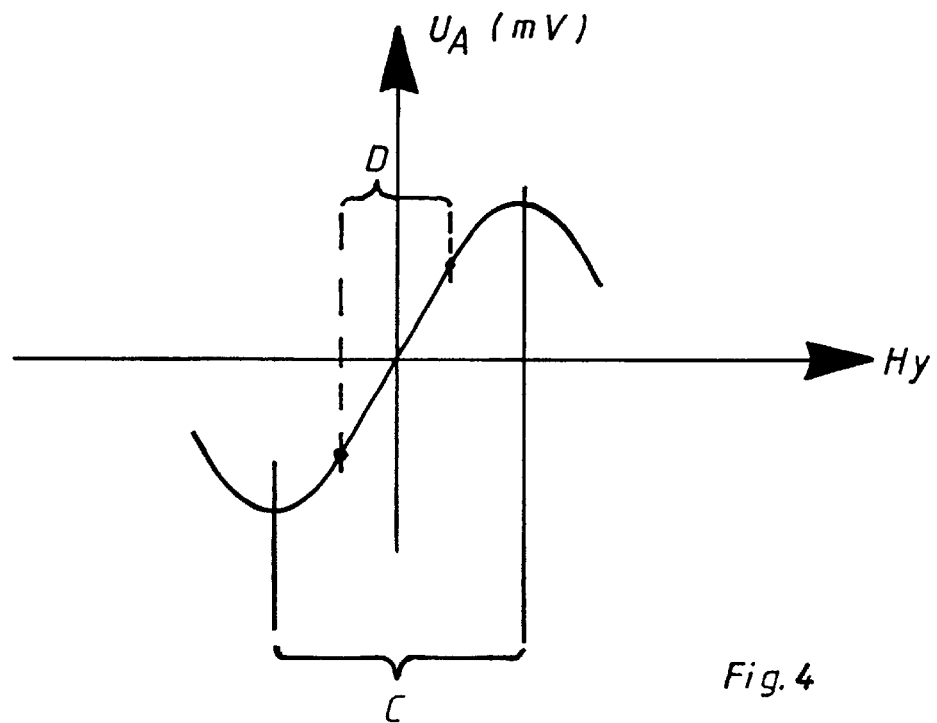
FIG. 4 shows a sensor characteristic curve.

Referring to FIG. 4, the measurements are carried out in the approximate linear region (D) of the characteristics curve. If a fault, such as a short circuit occurs, the measurements can also be carried out in a fault-free fashion if the measurement is carried out in accordance with FIG. 4 in the region (C) of the characteristics curve.

The settings for the measurements in the approximate linear region of the characteristics curve are advantageously carried out by means of compensation currents. However, it is also possible to carry out the measurements without compensation currents.

When the currents $i_1$, $i_2$, $i_3$ flow, as illustrated in FIG. 3, in the same direction, the differences in the current strengths are determined by the sensors ($M_1$, $M_2$)

In another embodiment of the invention, the current conductor (22) can be arranged in such a way that the current has a negative direction of flow so that it is not the difference in the strengths of the magnetic fields which is determined by the sensors ($M_1$, $M_2$), but rather, in this case, the sum of the strengths of the magnetic fields is determined. This means that the sensors ($M_1$ and $M_2$) measure a relatively high field strength which in turn means that the maximum values of the signals of the sensors ($M_1$ and $M_2$) are relatively high. In this case, the sensors are in a high range of a characteristics curve and can approach the boundary region of a characteristics curve or even exceed it. This embodiment may be less advantageous because, when the direction of flow of the current is opposed, it is possible that there may not be a difference in the magnetic fields, in which case, it would be difficult to determine the measured values.

According to the invention, magnetoresistive sensors can be used with or without compensation currents. If a compensation current is not provided, the output signal at the sensor is not a linear representation of the current to be measured. For example, the output signal in this case is not formed in a sinusoidal way at the sensor with sinusoidal currents $i_1$, $i_2$, $i_3$, since the working point is in a higher characteristics curve region. In this case, it is also disadvantageous to determine the sum of the current strengths and select a negative direction of current, since there is again the risk of leaving the rising characteristics curve region.

Thus, when all the currents are flowing in the same direction, a compensation current can be dispensed with more satisfactorily.

Figure 5:
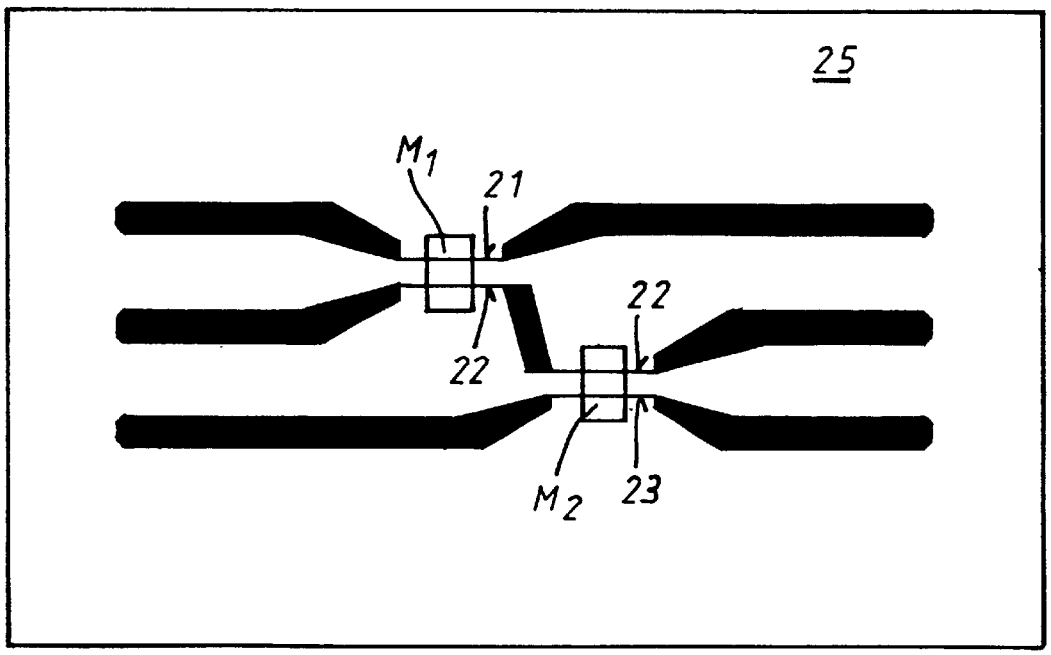
FIG. 5 shows a current measuring arrangement according to the invention.

FIG. 5 shows a current measuring arrangement (25) according to another embodiment of the invention, which has sensor chips ($M_1$, $M_2$). The current conductors (21, 22) are arranged in the measurement region of the sensor chip ($M_1$). The current conductors (22, 23) are arranged in the measurement region of the sensor chip ($M_2$).

The current conductor (23) is arranged at a distance away from the measurement range of the sensor chip ($M_1$). Likewise, the current conductor (21) is arranged at a distance away from the measurement region of the sensor chip ($M_2$), in order to avoid or reduce the influences of interference fields.

By determining the current strengths $i_1$, $i_2$, $i_3$, it is possible to determine a short circuit or a short circuit to ground and to react to this within very small reaction times in order to ensure reliable deactivation, for example, of an output stage.

In the case of a short circuit, a connection is undesirably produced, for example, between the current conductors (21 and 22) so that the sensor chip ($M_1$) essentially measures the short circuit current, which rises strongly in absolute terms, in the two current conductors.

In the case of a short circuit to ground, the current also rises very quickly. This current is measured by one of the sensor chips ($M_1$ or $M_2$), depending on where the short circuit to ground is located. In order to protect the output stage and the following equipment, a motor for instance, a maximum amplitude is specified for the phase currents. This maximum limit is compared in a comparator with the value from the sensor and it is thus ensured that the output stage is protected.

Figure 6:
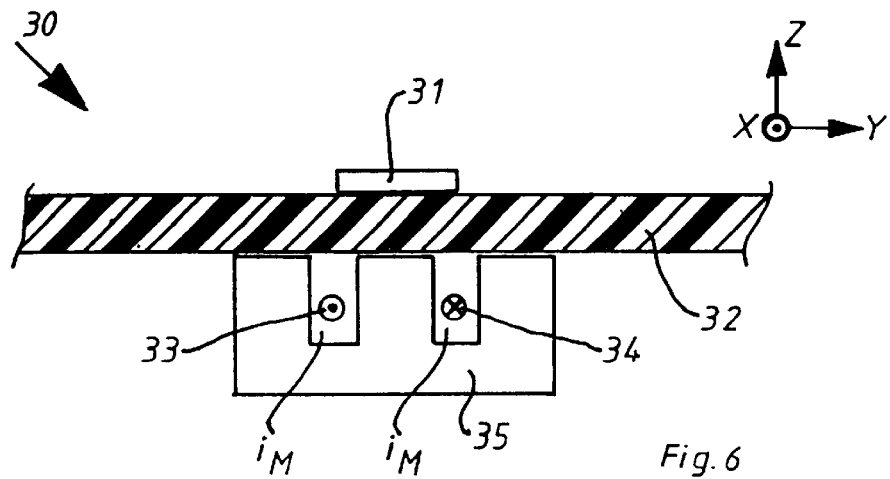
FIG. 6 shows an arrangement according to the invention with ferrite core.

FIG. 6 shows a device (30) with a sensor chip (31) which is arranged on an insulator (32), according to another embodiment of the invention.

On the side of the insulator (32) located opposite the sensor chip (31), two electrical current conductors (33, 34) are arranged. The current conductors (33, 34) are arranged inside a ferrite core (35). Preferably, the ferrite core (35) has essentially an E-shaped cross section. A ferrite core of another shape may also be used. Each current conductor (33, 34) is arranged in an air duct in the ferrite core (35) between the limbs of the ferrite core and at a certain distance away from the limbs.

Figure 7:
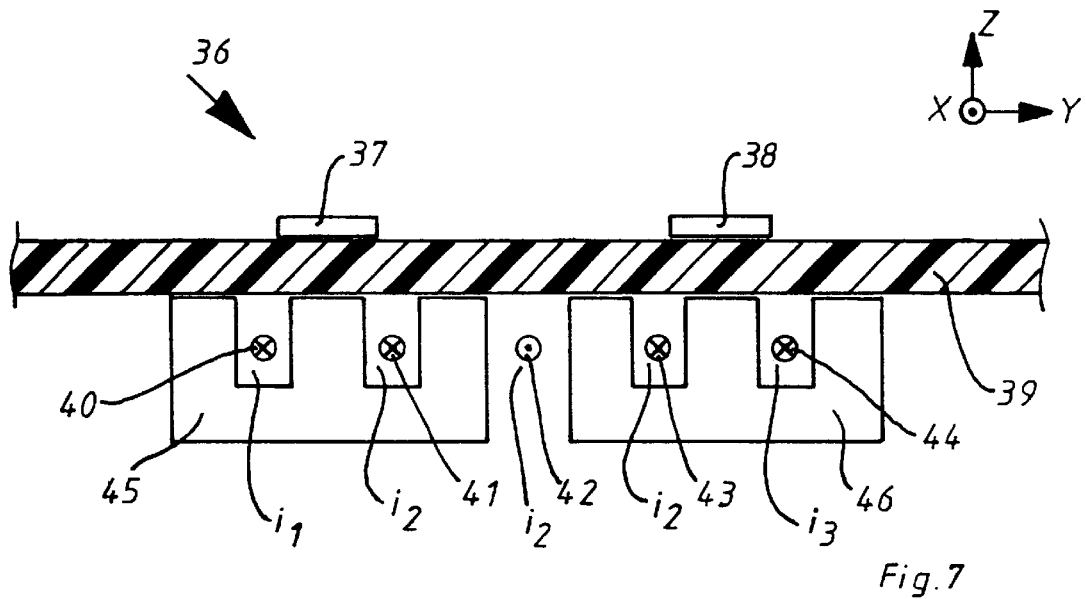
FIG. 7 shows another embodiment of the invention.

FIG. 7 shows yet another embodiment showing a design of a device (36). The device (36) has two sensor chips (37, 38) which are arranged on an insulator (39).

On the side of the insulator (39) located opposite the sensor chips (37, 38), electrical current conductors (40, 41, 42, 43, 44) are arranged.

A current $i_1$ flows through the current conductor (40), and a current $i_2$ flows through the current conductor (41). The direction of the current in the current conductors (40, 41) points into the plane of the drawing, as does the direction of the currents $i_2$ and $i_3$ of the current conductors (43, 44). The direction of the current in the current conductor (42) is out of the plane of the drawing. The current conductor (42) conducts a current of strength $i_2$.

The sensor chip (37) is located in the magnetic field which is formed by the currents $i_1$ and $i_2$ flowing in the conductors (40, 41). The sensor chip (38) is located in the magnetic field which is formed by the currents $i_2$ and $i_3$ of the current conductors (42, 43, 44).

The sensor chips (37, 38) are located on the same level, that is to say, one next to the other. The current conductors (40, 41) are arranged in a component (45) which is made of ferrite and which is of an essentially E-shaped design in cross section, in the preferred embodiment. Likewise, the current conductors (43, 44) are arranged in a ferrite component (46) which is of essentially E-shaped design in cross section, in the preferred embodiment.

By virtue of the measuring arrangement which is shown in FIGS. 6 and 7, and which has ferrite cores (35, 45, 46), magnetic shielding is obtained, with the result that fewer Eddy currents occur in adjacent metallic housing components and/or circuit carriers, such as, IMS (Insulated Metal Substrate) and DCB (Direct Copper Bonding) substrates.

A further advantage of this arrangement is the shielding obtained from external magnetic interference fields.

A more compact design is possible in accordance with FIG. 7, as compared to the design of FIG. 5, by virtue of the fact that the sensors (37, 38) are located more closely to one another. The magnetic shielding effect allows the sensors to be arranged one next to the other.

Figure 8:
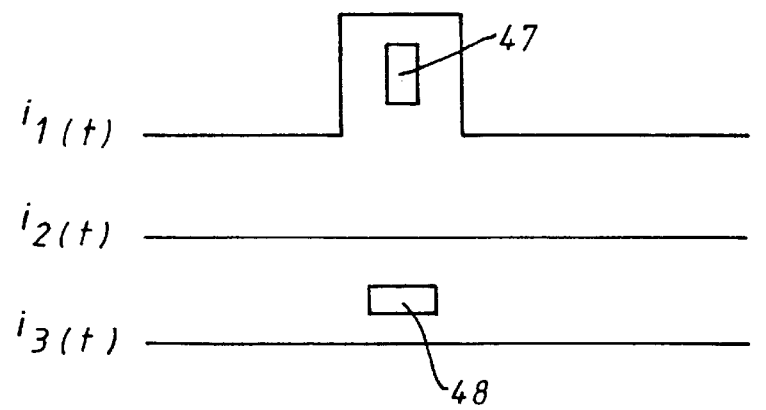
FIG. 8 shows an arrangement for current space vector evaluation according to the invention.

FIG. 8 shows a measuring arrangement for a current space vector evaluation means according to another embodiment of the invention.

In the modeling of polyphase machines for closed-loop control purposes, space vector representation has become the accepted practice. In the case of polyphase systems, the geometric displacement of the three windings by 120°/p (p=number of pole pairs) is evaluated and the electrical variables which act on the three windings are combined to form a complex space vector variable.

In a coordinate system which is fixed with respect to the stator, the real axis is usually positioned in such a way that it coincides with the direction of action of winding u. The following relationship is then obtained:

$$I_s(t) = \frac{2}{3}(i_a(t) + a \cdot i_b(t) + a^2 i_c(t))$$

where $$a = e^{i\frac{2\pi}{3}}$$

and $\underline{I}_s(t)$=complex number or $$I_s(t) = \begin{pmatrix} \text{Re}\{I_s(t)\} \\ \text{Im}\{I_s(t)\} \end{pmatrix} = \frac{2}{3} \begin{pmatrix} 1 & -\frac{1}{2} & -\frac{1}{2} \\ 0 & \frac{1}{\sqrt{3}} & -\frac{1}{\sqrt{3}} \end{pmatrix} \cdot \begin{pmatrix} i_a(t) \\ i_b(t) \\ i_c(t) \end{pmatrix} = \begin{pmatrix} i_\alpha(t) \\ i_\beta(t) \end{pmatrix}$$

Since $\Sigma i_{a,b,c}=0$ usually applies in the case of electric machines, the equations for the spatial vector are simplified to give:

$$I_s(t) = \frac{2}{3} \begin{pmatrix} I_a(t) \\ \frac{I_b(t)}{\sqrt{3}} - \frac{I_c(t)}{\sqrt{3}} \end{pmatrix}. \quad (7)$$

This transformation which, in the case of controlled drives, is usually carried out at the microcontroller/signal processor, can also be carried out with the current measurement device, if the measuring arrangement is of a suitable design.

In accordance with FIG. 8, an α sensor (47) determines a variable which is proportional to $i_{60}(t)$ and, a β sensor (48) determines a variable which is proportional to $(i_2(t)-i_3(t))$. The standardization according to Equation 7 can be allowed for during the analog conditioning of the signals.

As a result of the arrangement shown in FIG. 8, the measuring directions of the sensors (47, 48) are located orthogonally with respect to one another. Any influence which they exert on one another is thus minimized.

The contents of German documents 19716518.4, filed Apr. 19, 1997 and 19748550.2, filed Nov. 3, 1997 are hereby incorporated by reference.

The above-described embodiments are illustrative of the principles of the present invention. Other embodiments could be devised by those skilled in the art, without departing from the spirit and scope of the present invention.

What is claimed is:

1. A method for measuring electrical currents in n conductors (where n≧3 and where n is a natural number), comprising the step of:

carrying out the measurement of current in the n conductors with n−1 magnetoresistive sensors, the sensors measuring a difference in magnetic field strengths produced by the current of one or more conductors and each of the n conductor currents directly influencing at least one of n−1 magnetic field gradients created by the n conductors.

2. The method as claimed in claim 1, further comprising the step of determining current strengths ($i_n$) of the current in the n conductors.

3. The method as claimed in claim 1, further comprising the step of detecting at least one of an excess current and a fault current using the measured values.

4. The method as claimed in claim 1, further comprising the step of detecting at least one of voltages and power levels using the measured values.

5. The method as claimed in claim 1, wherein the conductor current sensed by each of the magnetoresistive sensors has a same direction of flow.

6. The method as claimed in claim 1, wherein at least one of the n conductor currents sensed by the magnetoresistive sensors has a current direction of flow which is opposite to the direction of current flow of other conductors.

7. The method as claimed in claim 1, wherein the magnetoresistive sensors use magnetic field compensation.

8. The method as claimed in claim 1, wherein the magnetoresistive sensors without a magnetic field compensation are used.

9. The method as claimed in claim 1, wherein the measurement of the n conductor currents is carried out for at least one of closed-loop control tasks and for detecting faults in electronic power actuators for electric drives.

10. The method as claimed in claim 1, further comprising the step of partially surrounding at least two of the n conductors with a ferrite sheath, the conductors being insulated with respect to the ferrite sheath.

11. The method as claimed in claim 1, further comprising the step of carrying out a current space vector evaluation such that two sensor output signals are generated in a system by measuring an individual current of a conductor with a first sensor and by determining the difference in two other conductor current with a second sensor, said sensor output signals representing an orthogonal current space vector of the symmetrical polyphase current system.

12. A device for measuring electrical currents comprising:

n conductors (where n≧2 and where n is a natural number); and (n−1) magnetoresistive sensors, the n current conductors being arranged in a vicinity of the (n−1) magnetoresistive sensors, the sensors being configured to sense the difference in the magnetic field strength produced by the current in the conductors;

wherein the current conductors are arranged in such a way that two current conductors are arranged in a vicinity of a measurement region of one of said sensors, and remaining current conductors are arranged at a distance away from the measurement region.

13. A device for measuring electrical currents comprising:

n conductors (where n≧2 and where n is a natural number); and (n−1) magnetoresistive sensors, the n current conductors being arranged in a vicinity of the (n−1) magnetoresistive sensors, the sensors being configured to sense the difference in the magnetic field strength produced by the current in the conductors wherein at least one of the n current conductors is arranged at least partially surrounded by a component with insulation with respect to the component and at a predetermined distance from the limbs of the component.

14. The device as claimed in claim 13, wherein the component is made of ferrite.

15. The device as claimed in claim 13, wherein at least one component is provided in each region of the (n−1) magnetoresistive sensors.

16. The device as claimed in claim 13, wherein the component has an essentially E-shaped cross section, and wherein the limbs of the component are arranged at least partially on an insulator.

17. The device as claimed in claim 16, wherein the current conductors are arranged between the limbs of the component and with insulation with respect to the component and at a distance from the limbs of the component.

18. A device for current space vector evaluation, comprising:

a conductor and first and second sensors, wherein two sensor output signals are generated in a system by measuring an individual current of the conductor with the first sensor and by determining the difference in two other conductors with the second sensor, said sensor output signals representing an orthogonal current space vector of the symmetrical polyphase current system, and wherein measuring devices of the two sensors are allocated orthogonally with respect to one another, in such a way that any influence which the magnetic field gradients exert on one another is minimized.

19. The method as claimed in claim 1, wherein $n \geq 3$.

20. A device for measuring electrical currents comprising:

n conductors (where $n \geq 2$ and where n is a natural number); and (n−1) magnetoresistive sensors, the n current conductors being arranged in a vicinity of the (n−1) magnetoresistive sensors, the sensors being configured to sense the difference in the magnetic field strength produced by the current in the conductors;

wherein $n \geq 3$.

* * * * *